(12) United States Patent
Krivokapic

(10) Patent No.: US 6,579,750 B1
(45) Date of Patent: Jun. 17, 2003

(54) MANUFACTURING METHOD FOR FULLY DEPLETED SILICON ON INSULATOR SEMICONDUCTOR DEVICE

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/974,217

(22) Filed: Oct. 9, 2001

Related U.S. Application Data

(62) Division of application No. 09/511,418, filed on Feb. 22, 2000, now Pat. No. 6,339,244.

(51) Int. Cl.$^7$ .................... H01L 21/00; H01L 21/84
(52) U.S. Cl. .................. 438/149; 438/163; 438/164; 438/174; 438/217; 438/301; 438/305
(58) Field of Search .................. 438/149, 158, 438/153, 154, 163, 164, 301, 302, 404, 412, 174, 217, 305, 480; 257/336, 351, 334, 408, 349, 347, 353, 354

(56) References Cited

U.S. PATENT DOCUMENTS

| 5,208,168 A | * | 5/1993 | Parrillo et al. ............. 438/297 |
| 5,359,219 A | * | 10/1994 | Hwang ...................... 257/351 |
| 6,190,982 B1 | * | 2/2001 | Tseng et al. ............... 438/305 |
| 6,342,423 B1 | * | 1/2002 | Ishida et al. ............... 438/303 |

* cited by examiner

*Primary Examiner*—Phat X. Cao
*Assistant Examiner*—Theresa T. Doan
(74) *Attorney, Agent, or Firm*—Mikio Ishimaru

(57) ABSTRACT

A silicon on insulator (SOI) semiconductor device is provided having a semiconductor substrate with an inverted region, an insulator, and a silicon island. The device combines the inverted region with channel doping to fully deplete the silicon island of majority carriers when the device is in the off state and both of its junctions are at ground.

21 Claims, 4 Drawing Sheets

MANUFACTURING METHOD FOR FULLY DEPLETED SILICON ON INSULATOR SEMICONDUCTOR DEVICE

CROSS-REFERENCE TO RELATED APPLICATION(S)

This is a divisional of copending application Ser. No. 09/511,418 filed on Feb. 22, 2000, now U.S. Pat. No. 6,339,244, which is incorporated by reference herein.

TECHNICAL FIELD

The present invention relates generally to silicon-on-insulator (SOI) semiconductor devices and more particularly to fully depleted SOI transistors.

BACKGROUND ART

In silicon semiconductor technology, the only way to achieve insulating substrates is by resorting either to silicon on insulator (SOI), silicon on sapphire (SOS), or etch and bond back to achieve SOI. The advantages of using an insulating substrate in CMOS and high speed field effect transistors (FETs) include latchup immunity, radiation hardness, reduced parasitic junction capacitance, reduced junction leakage currents and reduced short channel effects. Many of these advantages translate to increased speed performance of the FETs.

The SOI FETs are manufactured with an insulator, such as silicon dioxide, on a semiconductor substrate, such as silicon. The entire FETs, including their source, channel, drain, gate, ohmic contacts and channels, are formed on silicon islands in the insulator, and are insulated from any fixed potential. This results in what is called the "floating body" problem because the potential of the body or channel regions float or acquire a potential which can interfere with the proper functioning of the FETs. The floating body problem causes high leakage current and parasitic bipolar action since the semiconductor substrate is floating with respect to the channel. This problem has adverse affects on threshold voltage control and circuit operation.

In order to eliminate the floating body problem, it is necessary to fully deplete the silicon island. This means that the silicon island is sufficiently thin that the entire thickness of the body region is depleted of majority carriers when the FET is in the off state and both junctions are at ground. To be able to fully deplete the silicon island, it has been found that the silicon island must be extremely thin and in the order of 200 Å for a 50 nm SOI FET.

Unfortunately, silicon islands of 200 Å thickness are extremely difficult and costly to make. Further, at this thickness, the formation of the silicide necessary for the source/drain contacts to connect to the transistor may totally convert the silicon into silicide which would result in high resistance source/drain junctions.

Numerous attempts have been made to for fully depleted SOI FETs which avoid the thin silicon islands. Some designs provide body-substrate contacts to tie the body to a fixed potential. For example, some designs provide the body-substrate contact in the channel region, however, the since the gate remains capacitively coupled to both bulk charge and SOI charge, the advantages of an SOI are lost.

A solution to the above problems has long been sought, but only partially depleted SOI FETs have been introduced into production. A truly fully depleted SOI has long eluded those skilled in the art.

DISCLOSURE OF THE INVENTION

The present invention provides a silicon on insulator (SOI) semiconductor device having a semiconductor substrate with an inverted region, an insulator, and a silicon island. The device combines the inverted region with channel doping to fully deplete the silicon island of majority carriers when the device is in the off state and both of its junctions are at ground.

The present invention provides method of manufacturing a silicon on insulator (SOI) semiconductor device having a semiconductor substrate with an inverted region, an insulator, and a silicon island. The method provides the inverted region and channel doping to fully deplete the silicon island of majority carriers when the device is in the off state and both of its junctions are at ground.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
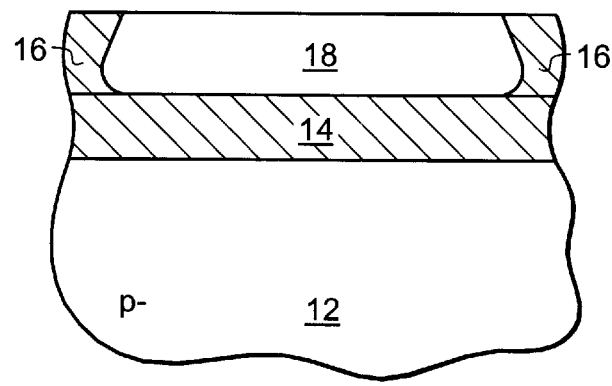
FIG. 1 is a cross-section of a silicon on insulator wafer.

Referring now to FIG. 1, therein is shown a silicon on insulator (SOI) wafer 10, which includes a semiconductor substrate 12 of a material such as a p-doped silicon (Si). On top of the semiconductor substrate 12 is a buried insulator layer 14 of a material such as a silicon dioxide ($SiO_2$) layer, and a shallow trench isolation 16, also of a material such as $SiO_2$, containing a semiconductor island 18 of a material such as a thin Si layer.

Figure 2:
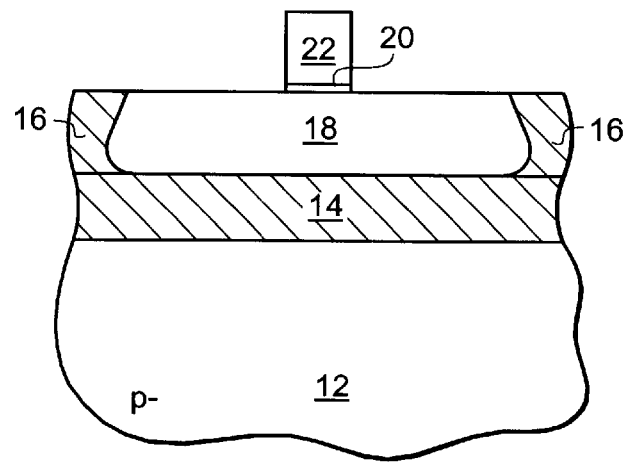
FIG. 2 shows the structure of FIG. 1 with a gate formed thereon.

Referring now to FIG. 2, therein is shown the structure of FIG. 1 after the conventional deposition, patterning, photolithography, and etching to form a gate dielectric 20 of a material such as silicon dioxide, silicon oxynitride (SiON) or nitride ($SiN_2$), and a floating gate 22 of a material such as polysilicon or amorphous silicon which can be either doped or undoped.

Figure 3:
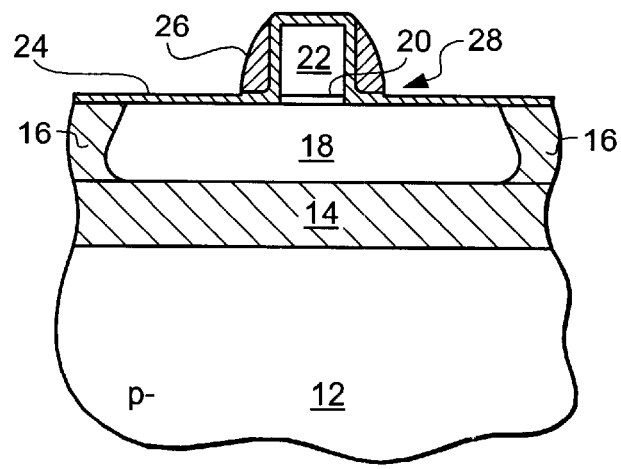
FIG. 3 shows the structure of FIG. 2 with a liner and spacer deposited thereon.

Referring now to FIG. 3, therein is shown the structure of FIG. 2 with a liner 24 of a material such as a silicon dioxide ($SiO_2$) deposited on the shallow trench isolation 16, the gate dielectric 20, and the floating gate 22. A spacer 26 of a material such as a $Si_3N_4$ is formed around the gate portion of the liner 24. The spacer 26 is over-etched to the point that some of the liner 24 is etched away as shown by a step 28.

The width of the spacer 26 determines the energy of subsequent implants because it controls the lateral diffusion of the implant underneath the spacer 26. In the best mode the width is in the range of 400–1000 Å and preferably around 500 Å.

Figure 4:
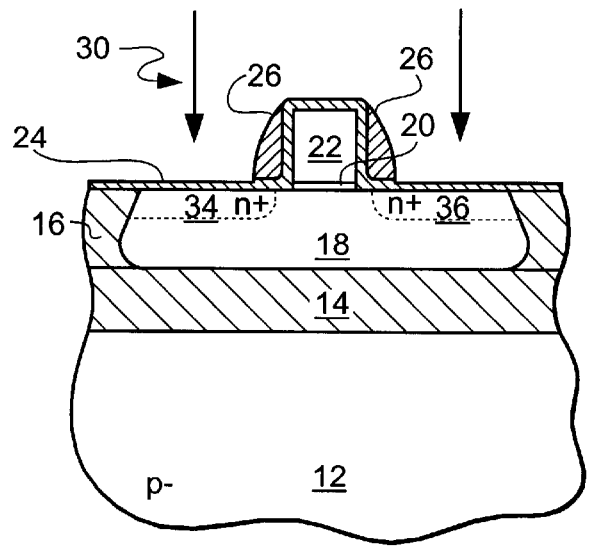
FIG. 4 shows the structure of FIG. 3 undergoing source/drain implantation.

Referring now to FIG. 4, therein is shown a dopant implantation 30 after the SOI wafer 10 has been masked to prevent doping of a channel 32 in the semiconductor island 18. A source/drain mask (not shown) is used to implant an n-type dopant, such as arsenic (As) to a depth of about one-third of the depth of the semiconductor island 18.

For a 1000 Å thick semiconductor island 18, the implant energy is selected to be between 15 to 20 KeV so that the implant will reach a depth of between 300 to 500 Å. The objective is to have the implant drive down sufficiently deep that a subsequent rapid thermal anneal (RTA) will eventually drive the implant down to at least 700 Å. The dopant does not need to go all the way down to the buried insulator level 14 because the depletion width of source/drain junctions 34 and 36 will be high enough that the source/drain contacts will be fully depleted on the buried insulator layer 14. If the implant has a final depth of less than 700 Å, it will not be possible to fully deplete the semiconductor island 18 and there will be increased junction capacitance, which is not desirable.

Figure 5:
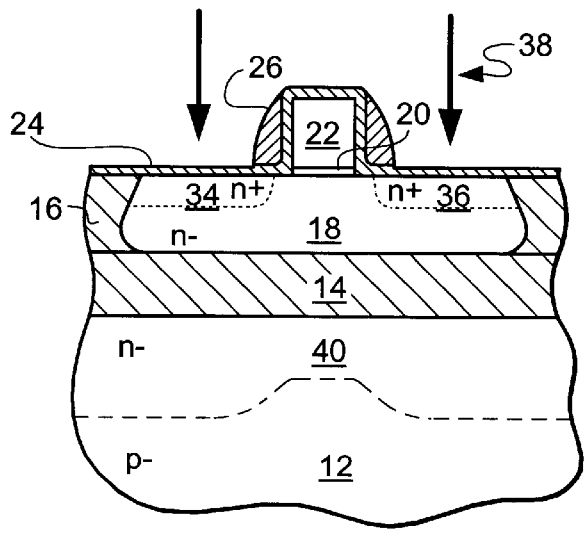
FIG. 5 shows the structure of FIG. 4 undergoing an inversion implantation.

Referring now to FIG. 5, therein is shown a n-type dopant implantation 38 which will invert the p-doped silicon in the semiconductor substrate 12 to form an n-silicon region 40. The floating n-region is implanted into the p-semiconductor substrate 12 to electrically prevent the electric fields from the drain to reach through the insulator to the source during operation because the electric field will cause a leakage path for the current to flow. Thus, the n-silicon region 40 will prevent flow of current from the drain through the buried insulator layer 14 to the source.

For a 1000 Å thick semiconductor island 18 of the best mode, the implantation 38 is a high-energy implant around 150 to 200 KeV with a dopant concentration in the range of 5e12 ($5\times10^{12}$) to 1e13 cm$^2$ ($1\times10^{13}$) to fully deplete the channel 32 in subsequent steps. If a higher dose is used, the dopant will accumulate underneath the floating gate 22 near the interface between the semiconductor island 18 and the buried insulator layer 14 and will be very difficult to counter-dope later. A high counter-doping with a material such as boron (B) will again prevent full depletion of the channel 32.

Figure 6:
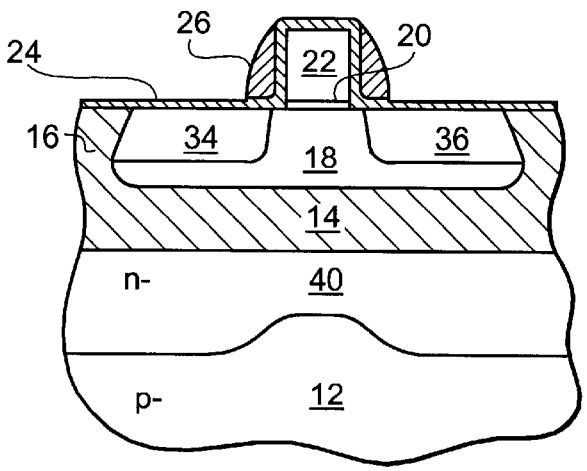
FIG. 6 shows the structure of FIG. 5 after a rapid thermal anneal.

Referring now to FIG. 6, therein is shown the result of an RTA performed on the SOI wafer 10. The RTA will cause enhanced thermal diffusion of the dopants to the desired locations. in the best mode, the RTA is from 5 to 10 seconds at temperatures in the range from 1025 to 1050° C. This will drive the dopants in the source/drain junctions 34 and 36 to the depth of two-thirds the semiconductor island 18 or 750–800 Å.

Figure 7:
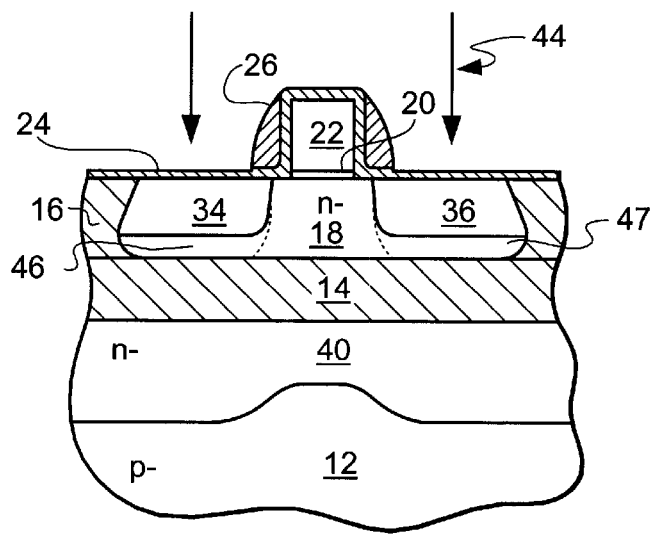
FIG. 7 shows the structure of FIG. 6 undergoing a punch-through prevention implantation.

Referring now to FIG. 7, therein is shown the structure of FIG. 6 being subjected to a punch-through prevention implantation 44 using a dopant to form punch-through prevention regions 46 and 47. The floating gate 22 is used as a mask to implant the dopants at the edges of and underneath the source/drain junctions 34 and 36, but not in the channel 32 because that would increase the total concentration of acceptors in the channel 32 and make it difficult to fully deplete the channel 32 afterward.

In the best mode, it has been determined that a fully depleted channel 32 could not be obtained if the implant dosage of B is higher than 1e13 and, if the dosage is less than 5e12, it was not possible to prevent punch-through leakage between the source/drain junctions 34 and 36 during operation. The implantation is performed at an energy level of 35 to 40 KeV.

Figure 8:
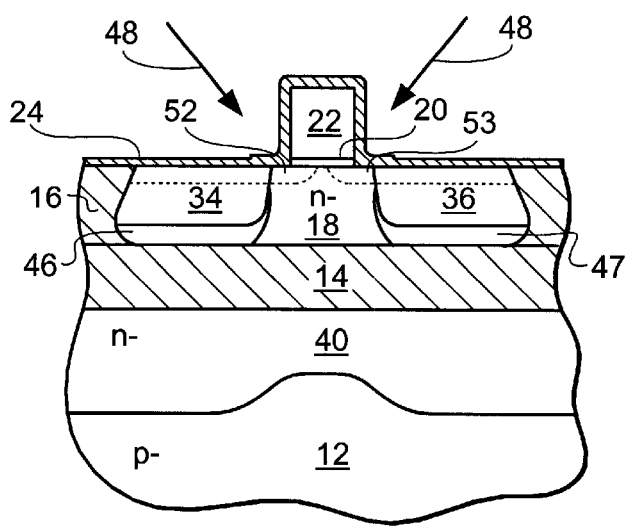
FIG. 8 shows the structure of FIG. 7 undergoing a shallow channel implantation.

Referring now to FIG. 8, therein is shown the spacer 26 removed and a shallow channel implantation 48 being made at an angle around the floating gate 22 to form implanted regions 52 and 53. The dopant assists in the depletion of the channel 32. The shallow channel implantation 48 is preferably performed at a tilt of 45° from the vertical but may range from 25°–45° because of the necessity to integrate various other semiconductor devices on the wafer which may have shadowing effects due to the masking of one device on another.

In the best mode, the shallow channel implantation 48 is performed with a dopant such as boron difluoride ($BF_2$) and the energy is from 25 to 35 KeV.

Figure 9:
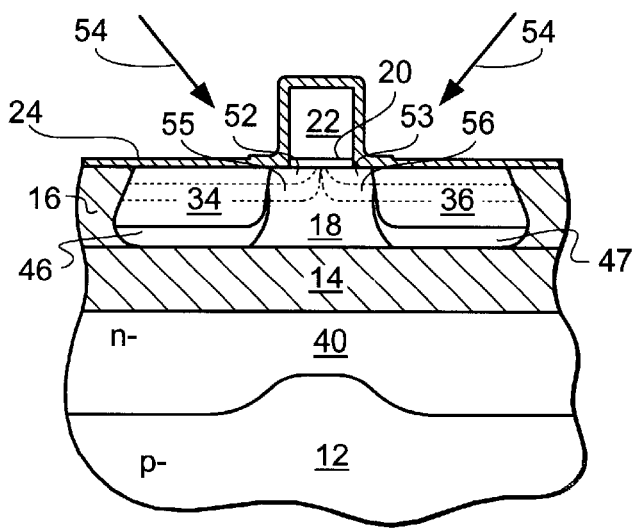
FIG. 9 shows the structure of FIG. 8 undergoing a deep channel implantation.

Referring now to FIG. 9, therein is shown a deep channel implant 54, which is a deeper implant than the shallow channel implantation 48 and which forms the deep channel implant regions 55 and 56. Again, the deep channel implantation 52 is performed around the floating gate 22 at various angles ranging from 25°–45° with 45° being preferred.

In the best mode, the deep channel implant 52 is preferably performed with a dopant such as B with the implantation energy in the range from 11 to 15 KeV.

Figure 10:
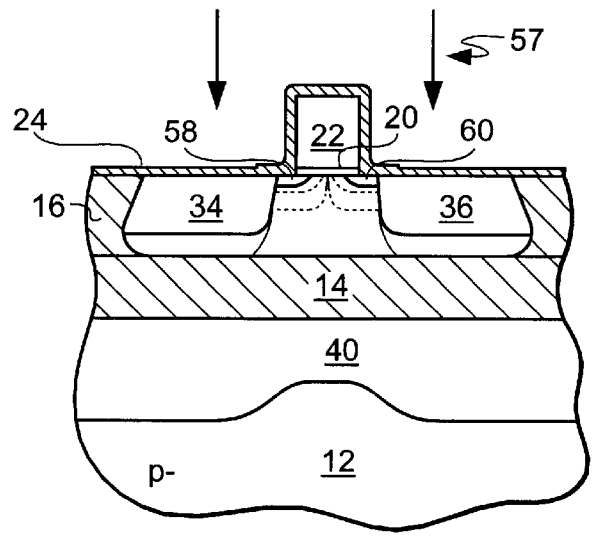
FIG. 10 shows the structure of FIG. 9 undergoing source/drain extension junction implantation.

Referring now to FIG. 10, therein is shown a source/drain extension junction implantation 57, which forms the source/drain extension junctions 58 and 60.

In the best mode the source/drain extension junctions 58 and 60 are formed with an n-type dopant, such as phosphorus (P), which is implanted at an energy level from 3 to 5 KeV, to take into account variations in the liner thickness, and at a low-dosage of from 3e14 to 8e14 cm$^2$.

Figure 11:
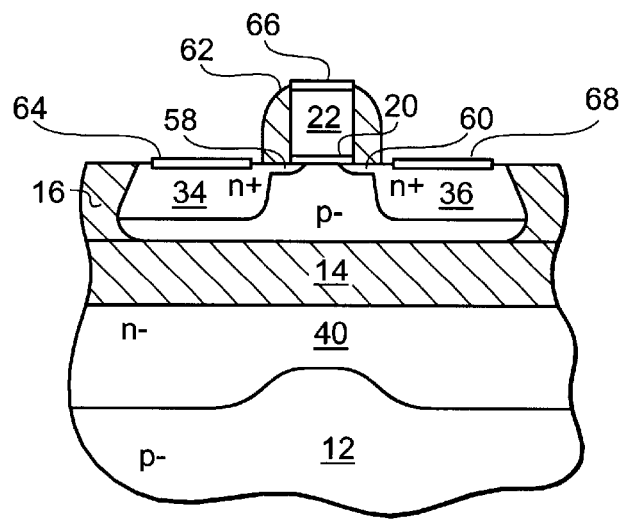
FIG. 11 shows the fully depleted silicon on insulator device of the present invention.

Referring now to FIG. 11, therein is shown the structure of FIG. 10 after an annealing step. The anneal can be a very short RTA for 1 to 2 seconds at 1000° C., or can be a spike RTA of a temperature up to 1025° C. to fully deplete the semiconductor island 18 with source/drain extension junctions 58 and 60 and source/drain junctions 34 and 36. A spacer 62 has also been deposited which is used in forming the contact connection silicide. The spacer 62 causes the silicide to form as salicide (self-aligned silicide) regions 64, 66, and 68, which are respectively formed over the source/drain junction 34, the floating gate 22, and the source/drain junction 36.

In the best mode, the silicon island 18 can range from 200 to 2000 Å thick with the thinner thicknesses making it easier to fully deplete the silicon island 18. However, the thickness used for non-fully depleted SOI currently is 1000 Å and the parameters of the preferred mode are optimized for this thickness silicon island.

Similarly, the buried insulator layer 14 can range from 200 to 2000 Å thick with the thinner thickness making it easier to fully deplete the silicon island 18. However, if it becomes too thin, capacitive coupling of the floating gate 22 and the silicon island 18 will deteriorate the sub-threshold voltage slope, which is related to changes in the doping. The current standard for non-fully depleted devices is around 2000 Å thick for the buried insulator layer 14 and the parameters of the preferred mode are optimized for this thickness silicon island 18.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters set forth herein or shown in the accompanying drawings are to be interpreted in an illustrative and non-limiting sense.

The invention claimed is:

1. A method for manufacturing a semiconductor comprising the steps of:
   providing a semiconductor substrate having an insulator thereon with a semiconductor island in the insulator;
   forming a gate dielectric and a gate on the semiconductor island;
   forming a spacer around the gate;
   forming source/drain junctions in the semiconductor island adjacent to the spacer, the source/drain junctions defining a channel therebetween;
   removing the spacer;
   forming an inverted region in the semiconductor substrate under the gate;
   forming a channel region in the channel whereby the semiconductor island is depleted of majority carriers; and
   forming source/drain extension junctions in the semiconductor island extending under the gate dielectric and in the source/drain junctions.

2. The method for manufacturing a semiconductor as claimed in claim 1 including the step of forming a deep channel region in the channel between the source/drain junctions deeper than the channel region.

3. The method for manufacturing a semiconductor as claimed in claim 1 including a step of forming a punch-through protection region under the source/drain junctions.

4. The method for manufacturing a semiconductor as claimed in claim 1 including a step of rapid thermal annealing of the semiconductor substrate and the semiconductor island.

5. The method for manufacturing a semiconductor as claimed in claim 1 wherein the step of providing a semiconductor substrate includes providing a semiconductor island having a thickness of less than 2000 Å.

6. The method for manufacturing a semiconductor as claimed in claim 1 wherein the step of providing a semiconductor substrate provides an insulator thereon having a thickness between 200 to 2000 Å.

7. The method for manufacturing a semiconductor as claimed in claim 1 including a step of:
   forming a liner over the gate, the semiconductor island, and the insulator; and wherein the steps of:
      forming the source/drain junctions, the inverted region, the doped channel region, and the source/drain extension junctions are performed through the liner.

8. A method for manufacturing a semiconductor comprising:
   providing a semiconductor substrate of a first conductivity type having an insulator thereon with a silicon island provided in the insulator;
   forming a gate dielectric and a gate on the silicon island;
   forming a spacer around the gate;
   implanting source/drain junctions of a second conductivity type in the silicon island adjacent to the spacer, the source/drain junctions defining a channel therebetween;
   removing the spacer, implanting an inverted region of the second conductivity type in the semiconductor substrate under the gate;
   implanting a channel region of the first conductivity type in the channel; and
   implanting source/drain extension junctions of the second conductivity type in the silicon island extending under the gate dielectric and in the source/drain junctions
   implanting a deep channel region of the first conductivity type in the channel deeper than the implanting of the channel region; and
   wherein the steps of:
      implanting the channel region and the deep channel region are performed at an angle, around the gate.

9. The method for manufacturing a semiconductor as claimed in claim 8 including a step of forming a punch-through protection region of a second conductivity type under the source/drain junctions.

10. The method for manufacturing a semiconductor as claimed in claim 8 including steps of rapid thermal annealing after implanting the source/drain junctions and rapid thermal annealing after implanting the source/drain extension junctions.

11. The method for manufacturing a semiconductor as claimed in claim 8 wherein the step of providing the silicon substrate includes providing a silicon island having a thickness of approximately 1000 Å.

12. The method for manufacturing a semiconductor as claimed in claim 8 wherein the step of providing the silicon substrate includes providing an insulator having a thickness of less than 2000 Å.

13. The method for manufacturing a semiconductor as claimed in claim 8 including a step of:
   depositing a liner over the gate, the semiconductor island, and the insulator; and wherein the steps of:
      implanting the source/drain junctions, the inverted region, the doped channel region, and the source/drain extension junctions are performed through the liner.

14. A method for manufacturing a semiconductor comprising the steps of:
   providing a p-silicon substrate having an insulator thereon with a silicon island in the insulator;
   forming a gate dielectric and a gate on the silicon island;
   forming a spacer around the gate;
   implanting n+doped source/drain junctions in the silicon island adjacent to the spacer, the source/drain junctions defining a channel therebetween;
   removing the spacer;
   implanting an n-type inverted region in the silicon substrate under the gate;
   implanting a p-type punch-through prevention region in the silicon substrate under the n+source/drain junctions;
   implanting a shallow p-type region in the channel;
   implanting a deep p-type region in the channel; and
   implanting n+doped source/drain extension junctions extending under the gate dielectric and in the source/drain junctions.

15. The method for manufacturing a semiconductor as claimed in claim 14 wherein the step of providing a p-silicon substrate provides a 2000 Å thick insulator and a 1000 Å thick silicon island.

16. The method for manufacturing a semiconductor as claimed in claim 14 wherein the step of implanting n+doped source/drain junctions is performed using an energy level from 15 to 20 KeV to implant to a depth of 300 to 500 Å.

17. The method for manufacturing a semiconductor as claimed in claim 14 wherein the step of implanting an n-type inverted region is performed using an energy level from 150 to 200 KeV with a dopant concentration from 5e12 to 1e13 cm².

18. The method for manufacturing a semiconductor as claimed in claim 14 wherein the step of implanting a p-type punch-through prevention region is performed using an energy level from 35 to 40 KeV with a dopant concentration in the range of 1e13 to 5e12 cm².

19. The method for manufacturing a semiconductor as claimed in claim 14 wherein the step of implanting the p-type shallow channel region is performed using a tilt from 25° to 45° from the vertical and an energy level of 25 to 35 KeV and the step of implanting the p-deep channel region is performed using an angle of 25° to 45° and an energy range of 11–15 KeV.

20. A The method for manufacturing a semiconductor as claimed in claim 14 including a step of performing a rapid thermal anneal for up to 10 seconds from 1000° to 1050° C.

21. The method for manufacturing a semiconductor as claimed in claim 14 wherein the step of implanting n+doped source/drain extension junctions is performed using an energy level from 3 to 5 KeV with a dopant concentration from 3e14 to 8e14 cm².

* * * * *